United States Patent
Lee et al.

(10) Patent No.: US 10,629,728 B1
(45) Date of Patent: Apr. 21, 2020

(54) SEMICONDUCTOR DEVICE AND FABRICATION METHOD THEREOF

(71) Applicant: UNITED MICROELECTRONICS CORP., Hsin-Chu (TW)

(72) Inventors: Zhi-Cheng Lee, Tainan (TW); Wei-Jen Chen, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/252,679

(22) Filed: Jan. 20, 2019

(30) Foreign Application Priority Data

Jan. 3, 2019 (TW) .............................. 108100160 A

(51) Int. Cl.
| | |
|---|---|
| *H01L 27/088* | (2006.01) |
| *H01L 29/78* | (2006.01) |
| *H01L 21/8234* | (2006.01) |
| *H01L 29/66* | (2006.01) |

(52) U.S. Cl.
CPC .... *H01L 29/7816* (2013.01); *H01L 21/82345* (2013.01); *H01L 21/823418* (2013.01); *H01L 21/823431* (2013.01); *H01L 21/823481* (2013.01); *H01L 27/0886* (2013.01); *H01L 29/66545* (2013.01); *H01L 29/66681* (2013.01)

(58) Field of Classification Search
CPC ..... H01L 21/823418; H01L 21/823431; H01L 21/82345; H01L 21/823481; H01L 29/7816; H01L 27/0886; H01L 29/66545; H01L 29/66681
USPC ......................................................... 257/401
See application file for complete search history.

(56) References Cited

U.S. PATENT DOCUMENTS

| | | | |
|---|---|---|---|
| 2015/0349093 A1* | 12/2015 | Harley | H01L 29/66795 257/288 |
| 2016/0141420 A1 | 5/2016 | Chen | |
| 2018/0096934 A1* | 4/2018 | Siew | H01L 21/76843 |

* cited by examiner

*Primary Examiner* — Brook Kebede
(74) *Attorney, Agent, or Firm* — Winston Hsu

(57) ABSTRACT

A semiconductor device including a substrate having a fin structure surrounded by a trench isolation region; a trench disposed in the fin structure; a silicon nitride trench-fill layer disposed in the trench; an interlayer dielectric layer disposed on the silicon nitride trench-fill layer; a working gate striding over the fin structure, on the first side of the trench; a dummy gate striding over the fin structure, on the second side of the trench; a doped source region in the fin structure; and a doped drain region in the fin structure. The dummy gate is disposed between the trench and the doped drain region.

32 Claims, 10 Drawing Sheets

US 10,629,728 B1

SEMICONDUCTOR DEVICE AND FABRICATION METHOD THEREOF

BACKGROUND OF THE INVENTION

1. Field of the Invention

The present invention relates to the field of semiconductor process technology, and more particularly to a fin field effect transistor (finFET) having a lateral double-diffused MOS (LDMOS) structure, which can improve the hot carrier injection (HCI) at the drain side.

2. Description of the Prior Art

The lateral double-diffused MOS (LDMOS) devices are widely used for different high voltage applications such as a switch-mode power supplies and power amplifiers. In CMOS transistors, hot carriers are generated by the impact ionization of on-state carriers at the high electric field region close to the gate and drain overlap region.

Fin field-effect transistors (finFETs) are 3-D device structures that can be used in nano-scale complementary metal-oxide-semiconductor (CMOS) and high-density memory applications. Bulk finFETs with lateral double-diffused MOS (LDMOS) structures, which are mostly used in RF power amplifiers, can provide a high breakdown voltage (e.g., between drain and source terminals).

However, existing LDMOS devices, particularly for N-type LDMOS devices, still have the hot carrier injection (HCI) problem at the drain side, which needs to be improved.

SUMMARY OF THE INVENTION

The present invention provides an improved fin field-effect transistor (finFET) device and a method of fabricating the same to address the deficiencies and shortcomings of the prior art described above.

An aspect of the invention provides a semiconductor device including a substrate having a fin structure surrounded by a trench isolation region. The fin structure includes a first-type well region and a second-type well region. The second-type well region is adjacent to the first-type well region with a well junction therebetween. A trench is disposed in the fin structure and in the second-type well region. A silicon nitride trench-fill layer is disposed in the trench. An interlayer dielectric (ILD) layer is disposed on the silicon nitride trench-fill layer. A working gate strides across the fin structure. The working gate is disposed on a first side of the trench, and the working gate overlaps the well junction. A dummy gate strides across the fin structure. The dummy gate is disposed on a second side of the trench opposite the first side. A source doping region is disposed in the fin structure. The source doping region is adjacent to the working gate. A drain doping region is disposed in the fin structure and adjacent to the dummy gate. The dummy gate is disposed between the drain doping region and the trench.

Another aspect of the invention provides a method of forming a semiconductor component. First, a substrate is provided, including a fin structure, surrounded by a trench isolation region. The fin structure includes a first-type well region and a second-type well region. The second-type well region is adjacent to the first-type well region with a well junction therebetween. A trench is formed in the fin structure. The trench is disposed in the second-type well region. A silicon nitride trench-fill layer is formed in the trench. An interlayer dielectric (ILD) layer is formed on the silicon nitride trench-fill layer. A working gate is formed across the fin structure. The working gate is disposed on a first side of the trench, and the working gate overlaps the well junction. A dummy gate is formed across the fin structure. The dummy gate is disposed on a second side of the trench opposite the first side. A source doping region is formed in the fin structure. The source doping region is adjacent to the working gate. A drain doping region is formed in the fin structure. The drain doping region is adjacent to the dummy gate, and the dummy gate is disposed between the trench and the drain doping region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
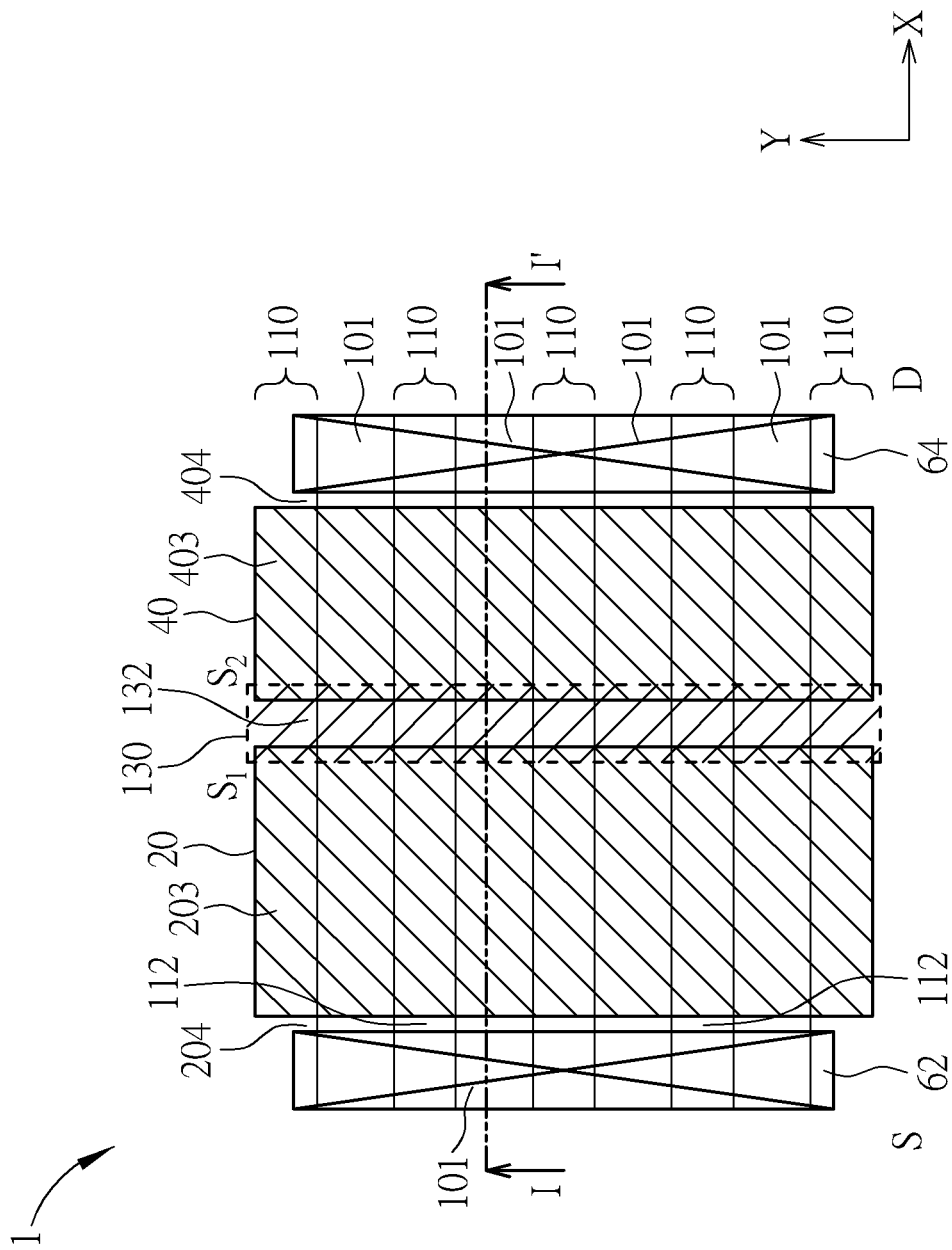
FIG. 1 is a schematic diagram showing the layout of a fin field-effect transistor having a lateral double diffused MOS structure according to an embodiment of the invention.
Figure 2:
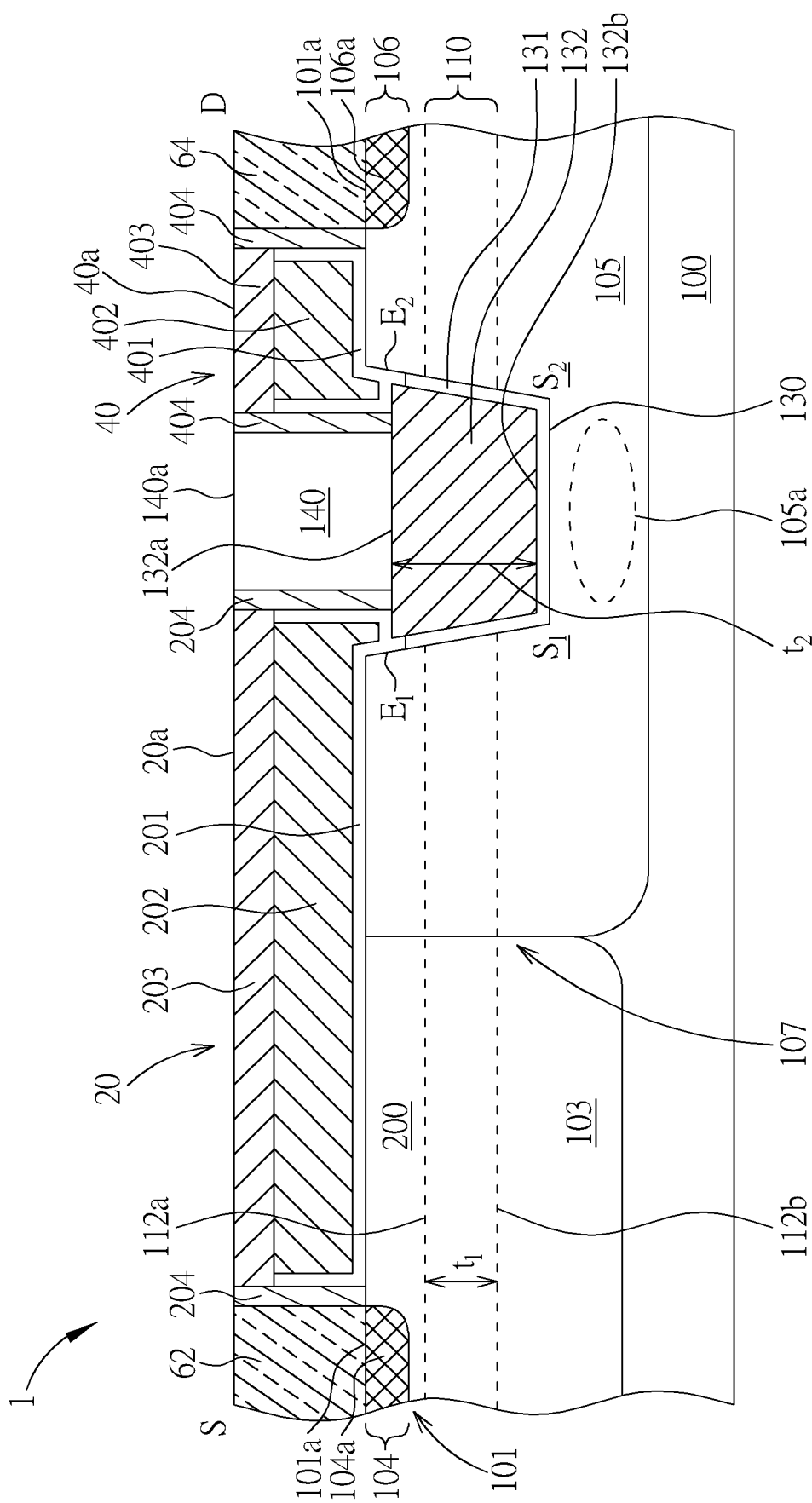
FIG. 2 is a schematic cross-sectional view taken along line I-I' in FIG. 1.

Please refer to FIG. 1 and FIG. 2. FIG. 1 is a schematic diagram showing a layout of a fin field-effect transistor (finFET) having a lateral double-diffused MOS (LDMOS) structure according to an embodiment of the invention. FIG. 2 is a schematic cross-sectional view taken along line I-I' in FIG. 1. As shown in FIG. 1 and FIG. 2, the fin field-effect transistor 1 of the present invention comprises a substrate 100, for example, a bulk silicon substrate, but is not limited thereto. The substrate 100 comprises a plurality of fin structures 101, for example, 2 to 8 fin structures 101, surrounded by the trench isolation region 110. In accordance with an embodiment of the invention, the trench isolation regions 110 include silicon oxide trench-fill layer 112. According to an embodiment of the invention, the fin structures 101 extend along a first direction (e.g., the reference X-axis direction in FIG. 1). The trench isolation regions 110 are substantially strip-shaped regions extending parallel to the fin structures 101 along the reference X-axis direction in FIG. 1.

In FIG. 2, the top surface 112a and the bottom surface 112b of the silicon oxide trench-fill layer 112 in the trench isolation regions 110 on both sides of the fin structure 101 are intentionally shown in broken lines. The portion of each fin structure 101 that protrudes from the top surface 112a of the silicon oxide trench-fill layer 112 is used to form the fin field-effect transistor 1 of the present invention. According to an embodiment of the invention, the substrate 100 is a bulk silicon substrate, and the fin structure 101 is a silicon fin structure, but is not limited thereto.

According to an embodiment of the invention, the fin structure 101 includes a first-type well region 103 and a second-type well region 105. The second-type well region 105 is adjacent to the first-type well region 103. A well junction 107 is formed between the first-type well region 103 and the second-type well region 105. According to an exemplary embodiment of the invention, the first-type well region 103 is a P-type well and the second-type well region 105 is an N-type well.

According to an embodiment of the invention, the fin field-effect transistor 1 further comprises a trench 130 disposed in the fin structure 101 and within the second-type well region 105. According to an embodiment of the invention, the trench 130 is filled with a silicon nitride trench-fill layer 132. According to an embodiment of the present invention, an interlayer dielectric (ILD) layer 140, such as a silicon oxide layer, is disposed directly above the silicon nitride trench-fill layer 132, but is not limited thereto.

According to an embodiment of the invention, the trench 130 extends along a second direction (e.g., the reference Y-axis direction in FIG. 1). The aforesaid first direction is not parallel to the second direction. According to an embodiment of the invention, the first direction is perpendicular to the second direction.

Figure 3:
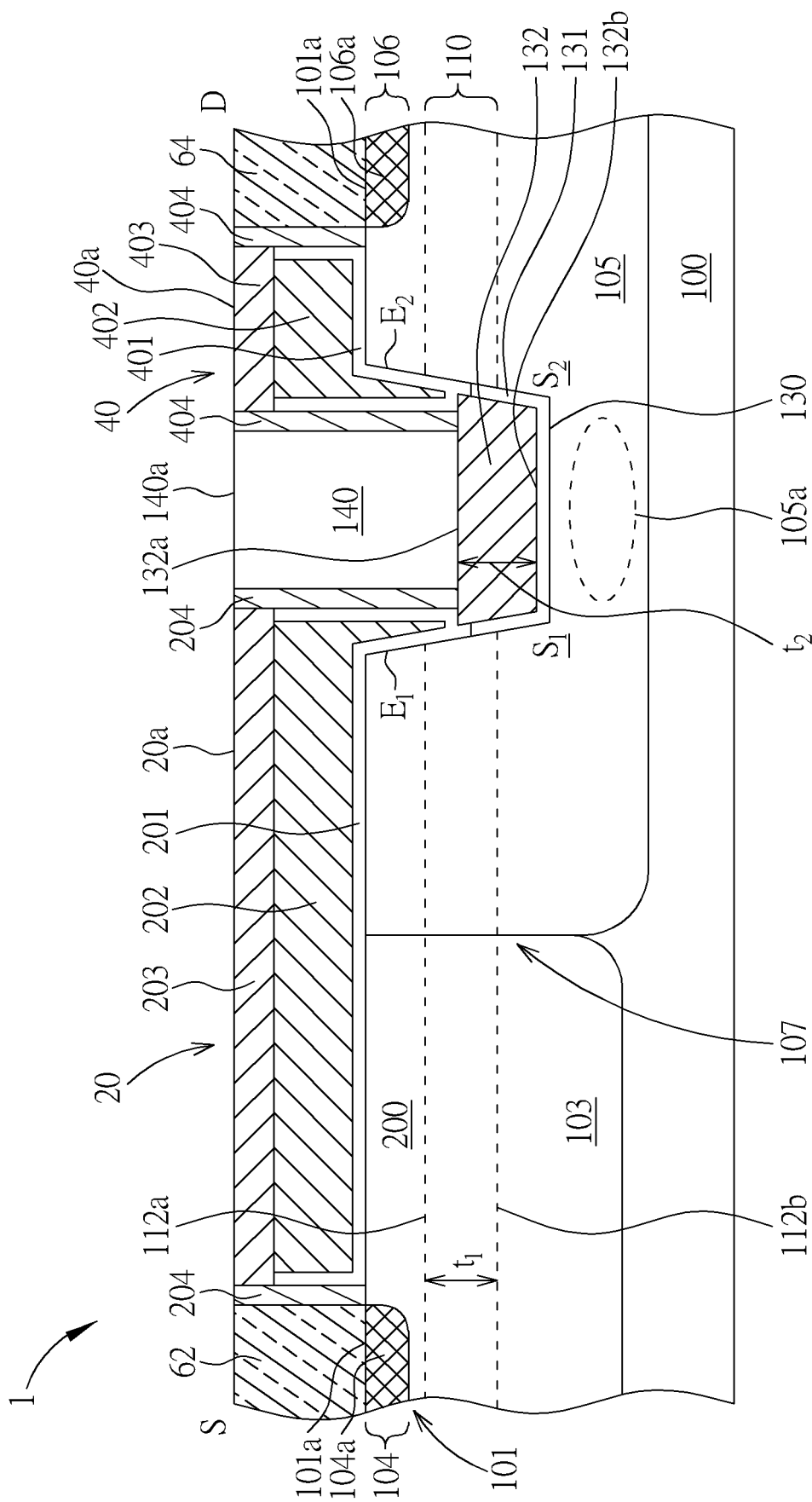
FIG. 3 is a cross-sectional view of a fin field-effect transistor having a lateral double diffused MOS structure according to another embodiment of the present invention.

According to an embodiment of the present invention, the thickness $t_2$ of the silicon nitride trench-fill layer 132 in the trench 130 is greater than the thickness $t_1$ of the silicon oxide trench-fill layer 112. The bottom surface 132b of the silicon nitride trench-fill layer 132 is lower than the bottom surface 112b of the silicon oxide trench-fill layer 112. In accordance with an embodiment of the invention, the ILD layer 140 is in direct contact with the silicon nitride trench-fill layer 132. The top surface 132a of the silicon nitride trench-fill layer 132 is lower than the top surface 101a of the fin structure 101. According to an embodiment of the present invention, a silicon oxide liner layer 131 is provided between the silicon nitride trench-fill layer 132 and the substrate 100. According to another embodiment of the present invention, as shown in FIG. 3, the thickness $t_2$ of the silicon nitride trench-fill layer 132 in the trench 130 may be approximately equal to the thickness $t_1$ of the silicon oxide trench-fill layer 112, wherein the bottom surface 132b of the silicon nitride trench-fill layer 132 is also lower than the bottom surface 112b of the silicon oxide trench-fill layer 112.

According to an embodiment of the invention, the fin field-effect transistor 1 further comprises a working gate 20 extending along the second direction across the fin structures 101. According to an embodiment of the invention, the working gate 20 is disposed on the first side $S_1$ of the trench 130, and the working gate 20 overlaps the well junction 107. In accordance with an embodiment of the invention, the working gate 20 is a metal gate that can be formed using a replacement metal gate (RMG) process. For example, the working gate 20 may include a gate dielectric layer 201, a metal layer 202, and an upper cap layer 203.

For example, the gate dielectric layer 201 may comprise a silicon oxide layer and/or a high dielectric constant (high-k) material layer. The metal layer 202 may comprise tungsten, titanium, titanium nitride, a work function layer, a barrier layer, and the like. The upper cap layer 203 may comprise silicon nitride or the like. According to an embodiment of the invention, a spacer 204, such as a silicon nitride spacer, may be disposed on the sidewall of the working gate 20, but is not limited thereto. In accordance with an embodiment of the invention, the spacers 204 are in direct contact with the ILD layer 140.

According to an embodiment of the invention, the fin field-effect transistor 1 further comprises a dummy gate 40 extending along the second direction across the fin structures 101. According to an embodiment of the invention, the dummy gate 40 is disposed on the second side $S_2$ of the trench 130 opposite the first side $S_1$. The working gate 20 and the dummy gate 40 are separated from each other by the ILD layer 140. In accordance with an embodiment of the present invention, the top surface 140a of the ILD layer 140 is flush with the top surface 20a of the working gate 20 and the top surface 40a of the dummy gate 40.

According to an embodiment of the invention, the trench 130 has a first edge $E_1$ above the top surface 132a of the silicon nitride trench-fill layer 132 on the first side $S_1$ and a second edge $E_2$ on the opposing second side $S_2$. The working gate 20 covers the first edge $E_1$ and the dummy gate 40 covers the second edge $E_2$.

Similarly, the dummy gate 40 is a metal gate that can be formed with the working gate 20 using a replacement metal gate (RMG) process. For example, the dummy gate 40 may comprise a gate dielectric layer 401, a metal layer 402, and an upper cap layer 403. For example, the gate dielectric layer 401 may comprise a silicon oxide layer and/or a high-k material layer. The metal layer 402 may comprise tungsten, titanium, titanium nitride, a work function layer, a barrier layer, and the like. The upper cap layer 403 may comprise silicon nitride or the like. According to an embodiment of the present invention, a spacer 404, such as a silicon nitride spacer, may be disposed on the sidewall of the dummy gate 40, but is not limited thereto.

According to an embodiment of the invention, the width of the working gate 20 of the fin field-effect transistor 1 of the present invention in the first direction may be greater than the width of the dummy gate 40 in the first direction. Those skilled in the art will appreciate that the working gate 20 and the dummy gate 40 in FIGS. 1 and 2 are merely illustrative and are not drawn to scale.

According to an embodiment of the invention, the fin field-effect transistor 1 further comprises a source doping region 104, for example, an N-type heavily doped region, disposed in the fin structure 101 and located in the first-type well region 103. The source doping region 104 is adjacent to the working gate 20. According to an embodiment of the invention, the fin field-effect transistor 1 further comprises a drain doping region 106 disposed in the fin structure 101 and located in the second-type well region 105. The drain doping region 106 is adjacent to the dummy gate 40. The dummy gate 40 is disposed between the trench 130 and the drain doping region 106. The channel region 200 is formed directly below the working gate 20 between the source doping region 104 and the well junction 107.

According to an embodiment of the invention, the source doping region 104 includes a source epitaxial layer 104a, and the drain doping region 106 includes a drain epitaxial layer 106a. According to an embodiment of the invention, the source epitaxial layer 104a comprises silicon phosphide (SiP) and the drain epitaxial layer 106a comprises silicon phosphide (SiP). The source epitaxial layer 104a is disposed in the first-type well region 103, and the drain epitaxial layer 106a is disposed in the second-type well region 105.

According to an embodiment of the invention, a source contact plug 62 is further disposed on the source doping region 104 to directly contact the source epitaxial layer 104a, and a drain contact plug 64 is further disposed on the drain doping region 106 to directly contact the drain epitaxial layer 106a. According to an embodiment of the present invention, as shown in FIG. 1, the source contact plug 62 and the drain contact plug 64 may be a slot contact plug structure extending along the second direction.

The present invention is characterized in that the fin structure 101 of the fin field-effect transistor 1 is provided with a trench 130, and the trench 130 is filled with a silicon nitride trench-fill layer 132. The high stopping ability of the silicon nitride trench-fill layer 132 enables the concentration of the N-type dopant in the region 105a directly below the trench 130 to be lower than that in the other N-type well portion during the ion implantation process in the well region 105. This can significantly reduce the electric field strength occurring near this region during operation, thereby effectively reducing the $I_{submax}/I_d$ current value during device operation, and improving the hot carrier injection (HCI) problem at the drain side of the device.

Figure 4:
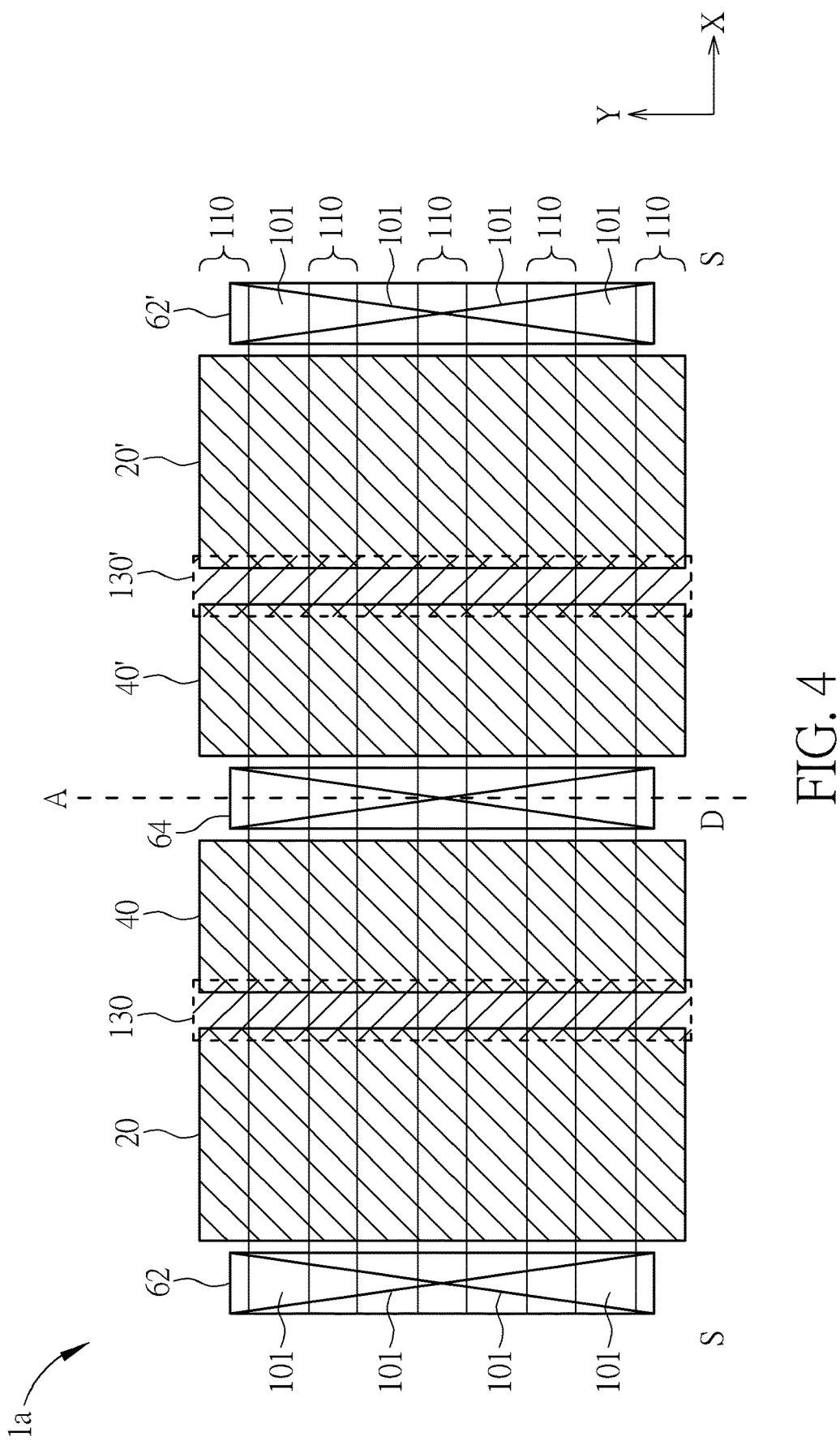
FIG. 4 is a schematic diagram showing the layout of a fin field-effect transistor having a lateral double-diffused MOS structure according to another embodiment of the present invention.

FIG. 4 is a schematic diagram showing the layout of a fin field-effect transistor having a lateral double-diffused MOS structure according to another embodiment of the present invention. As shown in FIG. 4, the fin field-effect transistor 1a may have a left-right symmetric layout structure with respect to a symmetry line A. The layout structure on the left side of the symmetry line A is the same as the layout structure depicted in FIG. 1, and the layout structure on the right side of the symmetry line A in FIG. 4 is mirror symmetrical with the layout structure on the left side of the symmetry line A.

According to an embodiment of the invention, the fin field-effect transistor 1a comprises a plurality of fin structures 101 extending along the first direction, two working gates 20, 20' extending in the second direction striding across the fin structures 101, and two dummy gates 40, 40' extending in the second direction striding across the fin structures 101. The drain D is located between the dummy gates 40, 40' and is provided with a contact plug 64. At both ends of the fin field-effect transistor 1a, the source S is provided with contact plugs 62, 62', respectively. Between the working gate 20 and the dummy gate 40 is a trench 130 extending along the second direction, and between the working gate 20' and the dummy gate 40' is a trench 130' extending along the second direction.

FIG. 5 to FIG. 10 are schematic perspective views showing a method of forming a semiconductor device in accordance with an embodiment of the present invention, wherein the same regions, material layers or elements are still denoted by the same reference numerals. For the sake of simplicity, only a portion of the structure on the substrate is shown through FIGS. 5 to 10, for example, only two fin structures are shown.

Figure 5:
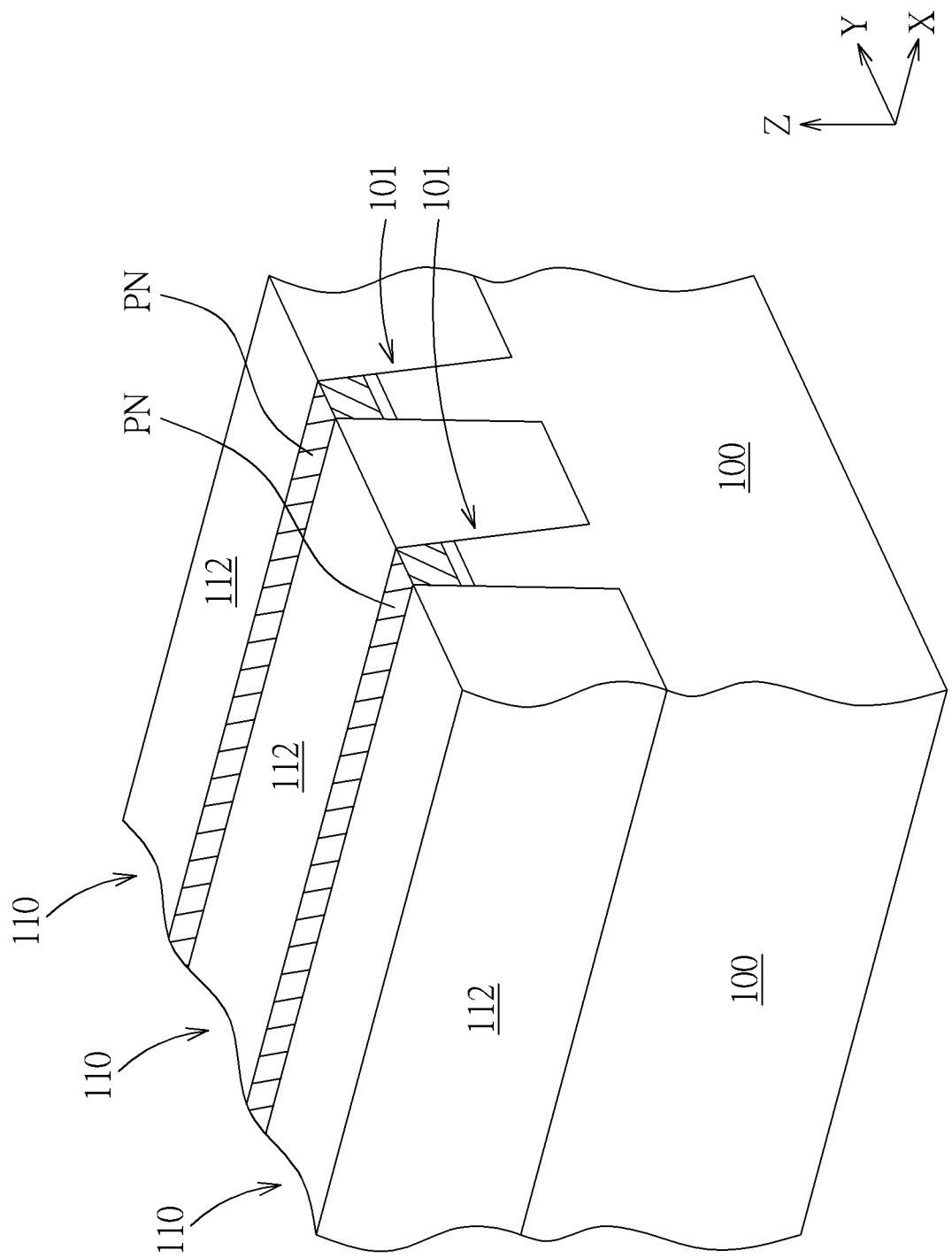
FIG. 5 to FIG. 10 are schematic perspective views showing a method of forming a semiconductor device according to an embodiment of the invention.

As shown in FIG. 5, a substrate 100 is first provided, including fin structures 101, surrounded by trench isolation regions 110 to be isolated from each other. According to an embodiment of the invention, the substrate 100 is a bulk silicon substrate and the fin structure 101 is a silicon fin structure. FIG. 5 shows the structure after the trench isolation region 110 is filled with the silicon oxide trench-fill layer 112 and after the CMP process completed. The silicon nitride pad layer PN directly above each fin structure 101 can be exposed at this point and can be flush with the surrounding silicon oxide trench-fill layer 112. The fin structures 101 and the trench isolation regions 110 extend along the first direction (reference X-axis direction).

Figure 6:
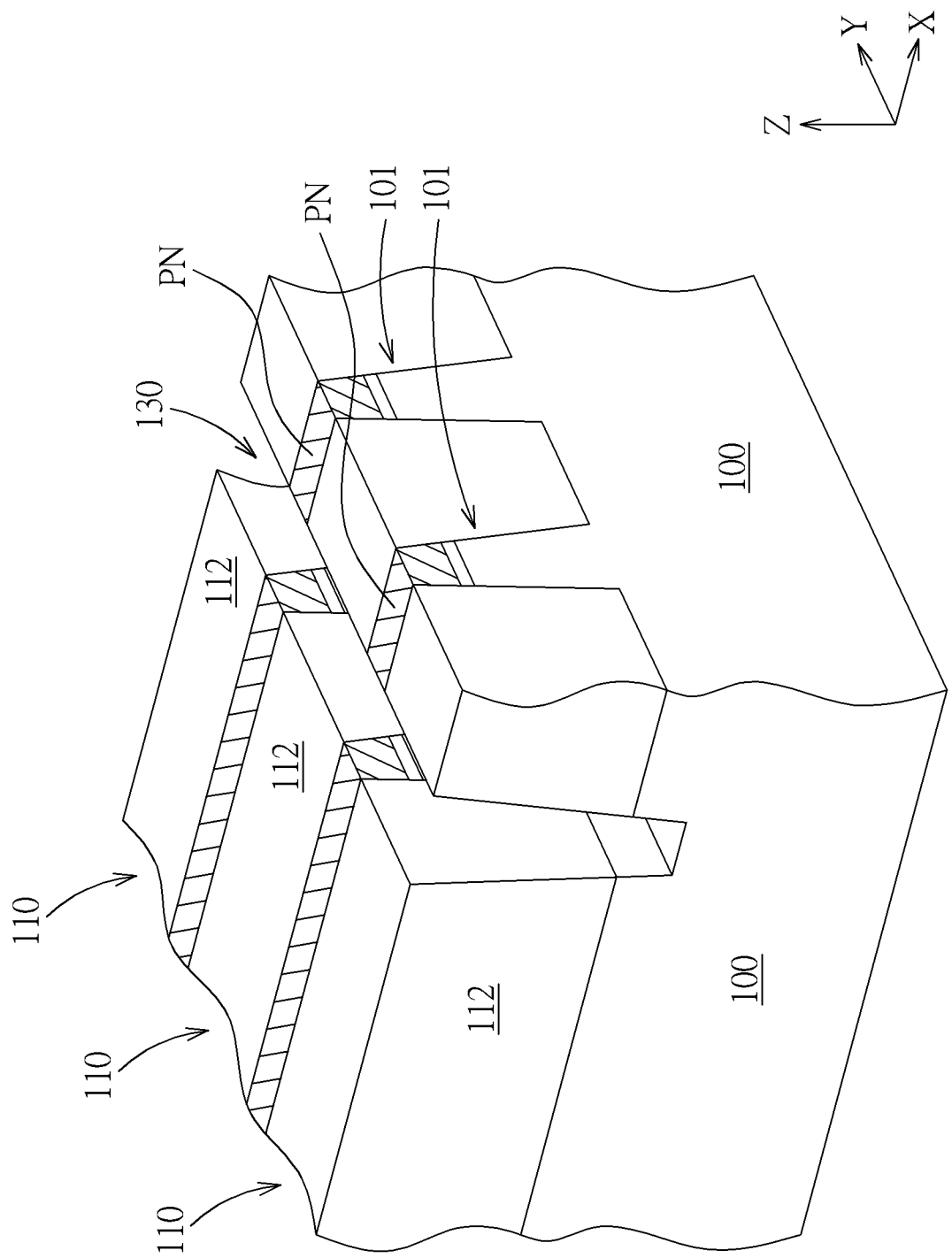

As shown in FIG. 6, lithography and etching processes are then performed to form a trench 130 in the fin structures 101 and the trench isolation region 110 extending in the second direction (reference Y-axis direction) and intersecting the fin structures 101. The aforesaid lithography and etching processes are well known techniques, and thus the details thereof will not be described.

It should be noted that the trench 130 can be completed simultaneously with a single diffusion break (SDB) process performed in other circuit regions. In other words, the trench 130 can be completed by using the same mask as the SDB process in other regions, so that an extra photo mask is not required. According to an embodiment of the invention, the depth of the trench 130 is deeper than the depth of the trench isolation region 110. For example, the depth of the trench 130 may be about 1200 angstroms, but is not limited thereto.

Figure 7:
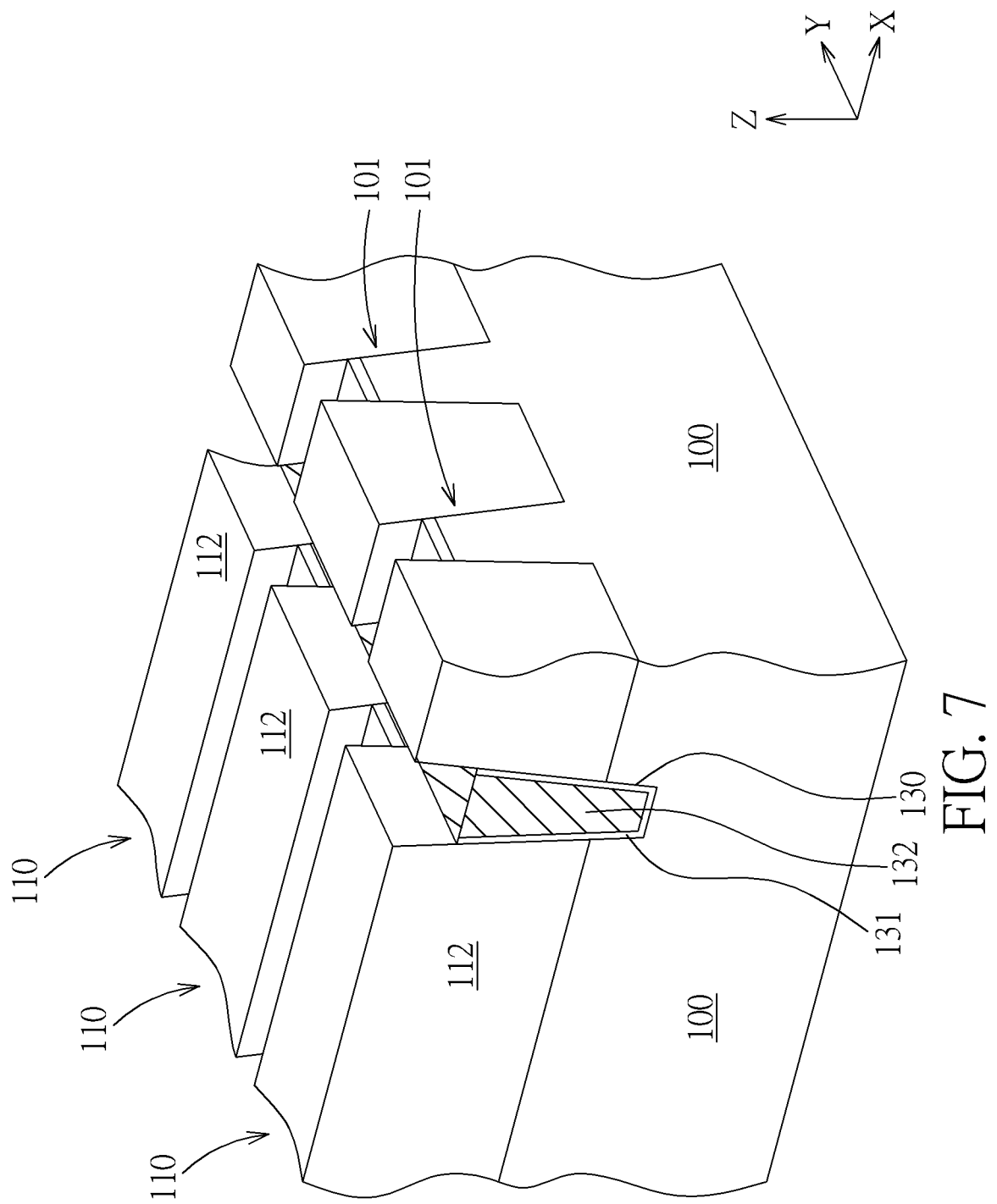

As shown in FIG. 7, a chemical vapor deposition (CVD) process and an etch back process are then performed to form a silicon nitride trench-fill layer 132 in the trench 130. At this point, the silicon nitride pad layer PN directly above the fin structure 101 may be etched away, and the top surface of the silicon nitride trench-fill layer 132 is lower than the top surface of the fin structure 101. In addition, a silicon oxide liner layer 131 may be formed on the surface of the substrate 100 in the trench 130 before depositing the silicon nitride trench-fill layer 132. The silicon oxide liner layer 131 is located between the silicon nitride trench-fill layer 132 and the substrate 100.

Figure 8:
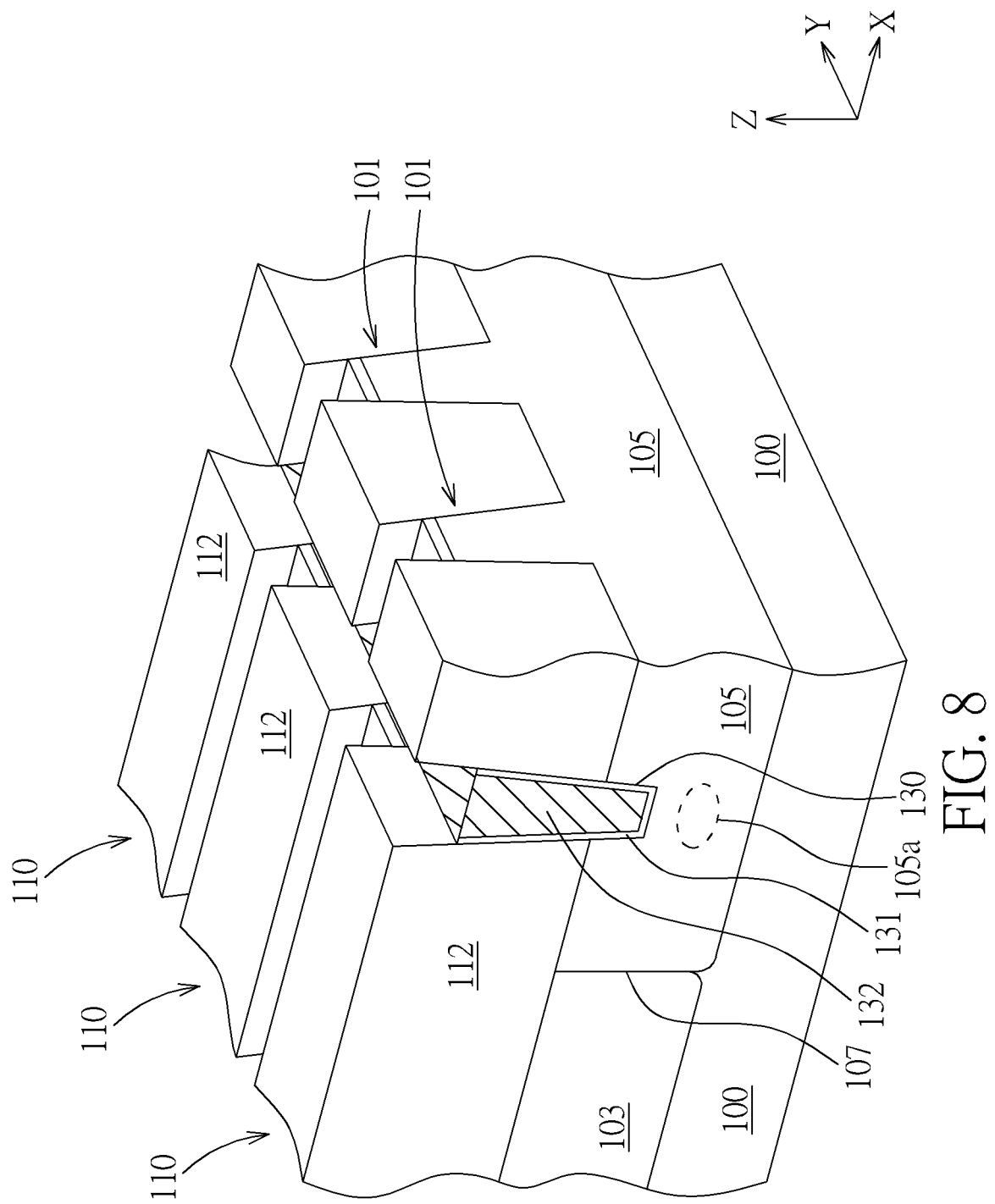

As shown in FIG. 8, an ion implantation process for forming well regions in the substrate 100 is performed to form a first-type well region 103, for example, a P-type well, and a second-type well region 105, for example, an N-type well, in the substrate 100. The second-type well region 105 is adjacent to the first-type well region 103 and a well junction 107 is formed between the first-type well region 103 and the second-type well region 105. In accordance with an embodiment of the invention, the trench 130 is disposed within the second-type well region 105 and is spaced apart from the well junction 107 by a predetermined distance.

As described above, in the ion implantation process step in FIG. 8, since the silicon nitride trench-fill layer 132 has a higher stopping ability (relative to the adjacent silicon oxide trench-fill layer 112), during the ion implantation process of the well region, the concentration of the N-type dopant in the region 105a directly below the trench 130 can be lower than that of the N-type dopant portion in the other N-type well portion, so that the electric field strength near the region can be significantly reduced during operation, thereby effectively reducing the $I_{submax}/I_d$ current value during device operation and improving the hot carrier injection (HCI) problem at the drain side of the device.

Figure 9:
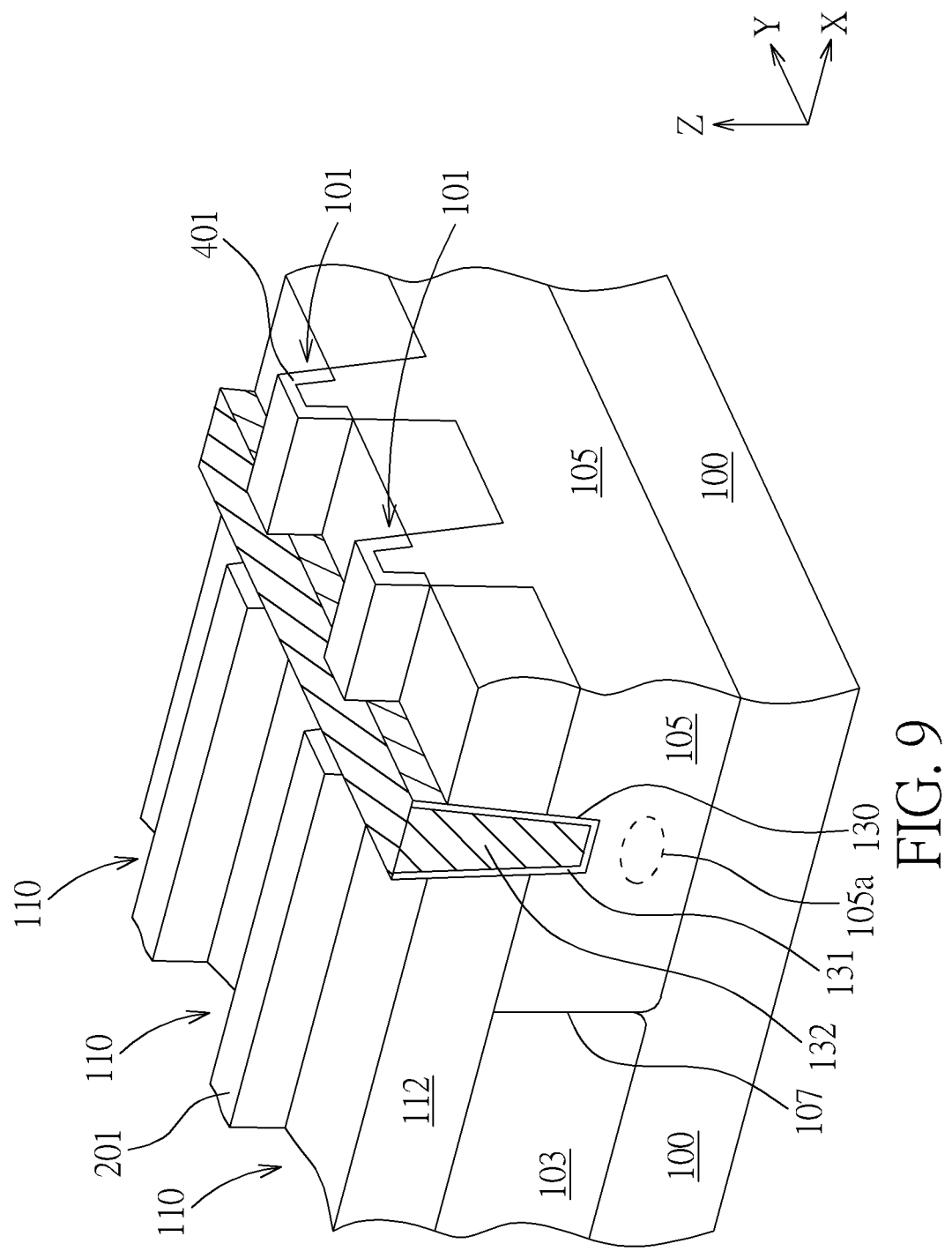

As shown in FIG. 9, subsequently, the silicon oxide trench-fill layer 112 is selectively etched back. After a portion of the silicon oxide trench-fill layer 112 is etched away, a portion of the fin structure 101 and an upper portion, including the upper sidewall, of the silicon nitride trench-fill layer 132 are exposed. Next, an oxidation process can be performed to oxidize the exposed fin structure 101 to form gate dielectric layers 201, 401, such as silicon dioxide.

Figure 10:
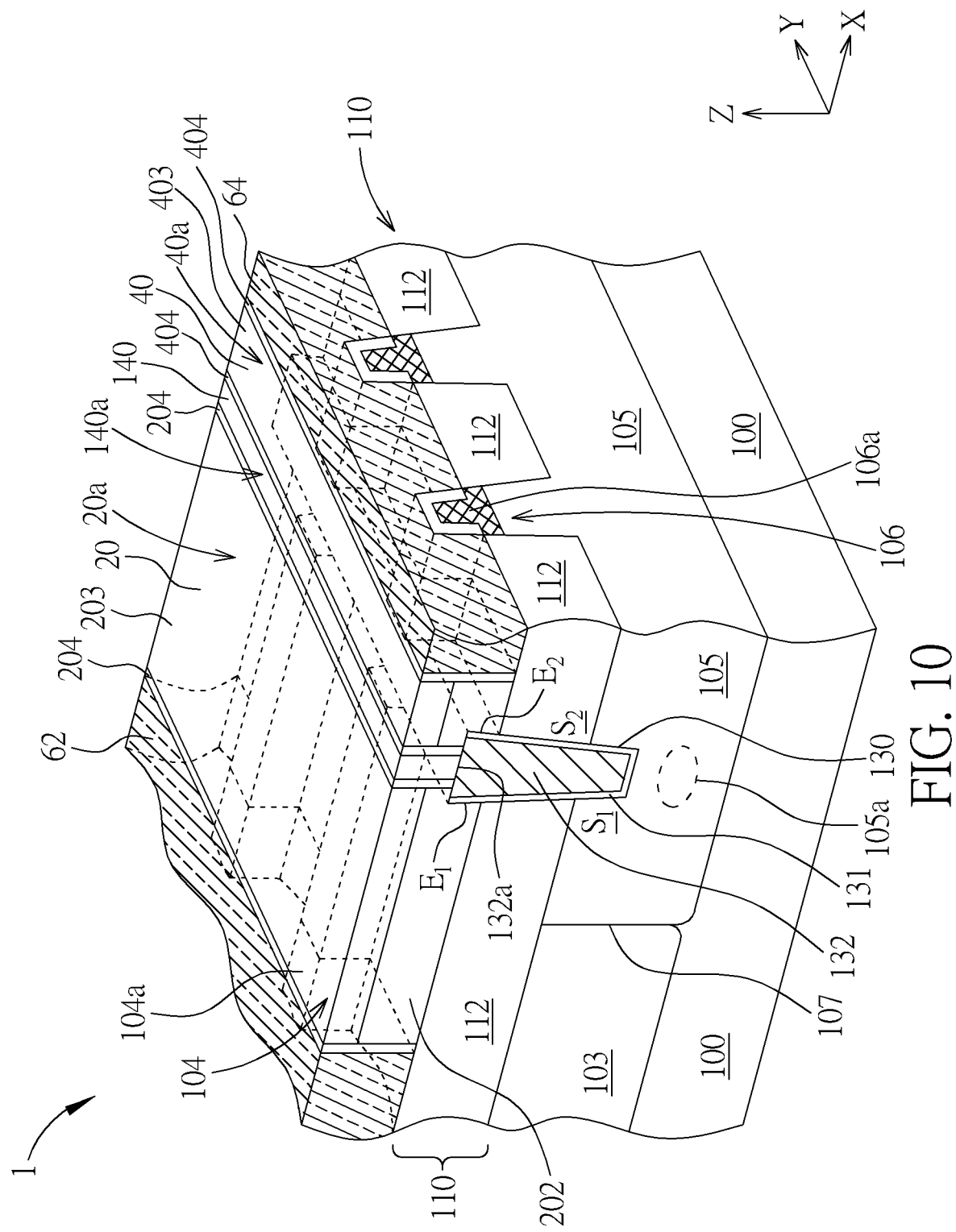

Subsequently, as shown in FIG. 10, a replacement metal gate (RMG) process may be performed to form the working gate 20 and the dummy gate 40 over the substrate 100 and across the fin structures 101. The RMG process is well known, so the details are not described here. For example, a polysilicon gate can be formed first, then an epitaxial process is performed to form a source or drain epitaxial layer, and then the polysilicon gate is replaced with a metal gate.

The working gate 20 is disposed on the first side $S_1$ of the trench 130, and the working gate 20 overlaps the well junction 107. The dummy gate 40 is disposed on the second side $S_2$ of the trench 130 opposite to the first side $S_1$. The working gate 20 and the dummy gate 40 are separated from each other by the ILD layer 140. The working gate 20 and the dummy gate 40 are both metal gates extending along the second direction. The trench 130 has a first (sidewall) edge $E_1$ on the first side $S_1$ and a second (sidewall) edge $E_2$ on the opposing second side $S_2$ above the top surface 132a of the silicon nitride trench-fill layer 132. The working gate 20 covers the first edge $E_1$ and the dummy gate 40 covers the second edge $E_2$. The top surface 140a of the ILD layer 140 is flush with the top surface 20a of the working gate 20 and the top surface 40a of the dummy gate 40.

According to an embodiment of the present invention, the source doping region 104 may be formed in the fin structure 101 before the working gate 20 and the dummy gate 40 are formed. The source doping region 104 is adjacent to the working gate 20. A drain doping region 106 is formed in the fin structure 101. The drain doping region 106 is adjacent to the dummy gate 40. The dummy gate 40 is disposed between the trench 130 and the drain doping region 106. A channel region is formed directly under the working gate 20 between the source doping region 104 and the well junction 107. The source doping region 104 comprises a source epitaxial layer 104a, and the drain doped region 106 comprises a drain epitaxial layer 106a. The source epitaxial layer 104a comprises SiP, and the drain epitaxial layer 106a comprises SiP. The source epitaxial layer 104a is disposed in the first-type well region 103, and the drain epitaxial layer 106a is disposed in the second-type well region 105.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate comprising a fin structure surrounding by a trench isolation region, wherein the fin structure comprises a first-type well region and a second-type well region adjacent to the first-type well region, and a well junction between the first-type well region and the second-type well region;
   a trench disposed in the fin structure and disposed in the second-type well region;
   a silicon nitride trench-fill layer disposed in the trench;
   an inter-layer dielectric (ILD) layer disposed on the silicon nitride trench-fill layer;
   a working gate striding across the fin structure, wherein the working gate is disposed on a first side of the trench, wherein the working gate overlaps the well junction;
   a dummy gate striding across the fin structure and is disposed on an opposing second side of the trench;
   a source doping region in the fin structure and is adjacent to the working gate; and
   a drain doping region in the fin structure and is adjacent to the dummy gate, wherein the dummy gate is disposed between the trench and the drain doping region.

2. The semiconductor device according to claim 1, wherein the fin structure extends along a first direction and the trench extends along a second direction, wherein the first direction is not parallel with the second direction.

3. The semiconductor device according to claim 2, wherein the first direction is perpendicular to the second direction.

4. The semiconductor device according to claim 2, wherein the working gate is spaced apart from the dummy gate with the ILD layer interposed therebetween, and wherein the working gate and the dummy gate extend along the second direction.

5. The semiconductor device according to claim 1 further comprising:
   a channel region between the source doping region and the well junction that is directly under the working gate.

6. The semiconductor device according to claim 1, wherein the trench isolation region comprises a silicon oxide trench-fill layer, and wherein the silicon nitride trench-fill layer in the trench has a thickness that is equal to or greater than the silicon oxide trench-fill layer, and wherein a bottom surface of the silicon nitride trench-fill layer is lower than a bottom surface of the silicon oxide trench-fill layer.

7. The semiconductor device according to claim 1, wherein the ILD layer is indirect contact with the silicon nitride trench-fill layer.

8. The semiconductor device according to claim 1, wherein a top surface of the silicon nitride trench-fill layer is lower than a top surface of the fin structure.

9. The semiconductor device according to claim 8, wherein the trench has a first edge on the first side and above the top surface of the silicon nitride trench-fill layer, and a second edge on the opposing second side, and wherein the working gate covers the first edge and the dummy gate covers the second edge.

10. The semiconductor device according to claim 1, wherein a top surface of the ILD layer is flush with a top surface of the working ate and a top surface of the dummy gate.

11. The semiconductor device according to claim 1 further comprising:
    a silicon oxide liner layer between the silicon nitride trench-fill layer and the substrate.

12. The semiconductor device according to claim 1, wherein the first-type well region is a P well region and the second-type well region is an N well region.

13. The semiconductor device according to claim 1, wherein the source doping region comprises a source epitaxial layer and the drain doping region comprises a drain epitaxial layer.

14. The semiconductor device according to claim 13, wherein the source epitaxial layer comprises SiP and the drain epitaxial layer comprises SiP.

15. The semiconductor device according to claim 13, wherein the source doping region is disposed within the first-type well region and the drain doping region is disposed within the second-type well region.

16. The semiconductor device according to claim 1, wherein the substrate is a bulk silicon substrate and the fin structure is a silicon fin structure.

17. A method for forming a semiconductor structure, comprising:
    providing a substrate comprising a fin structure surrounding by a trench isolation region, wherein the fin structure comprises a first-type well region and a second-type well region adjacent to the first-type well region, and a well junction between the first-type well region and the second-type well region;

forming a trench in the fin structure, wherein the trench is disposed in the second-type well region;

forming a silicon nitride trench-fill layer in the trench;

forming an inter-layer dielectric (ILD) layer on the silicon nitride trench-fill layer;

forming a working gate striding across the fin structure, wherein the working gate is disposed on a first side of the trench, wherein the working gate overlaps the well junction;

forming a dummy gate striding across the fin structure, wherein the dummy gate is disposed on an opposing second side of the trench;

forming a source doping region in the fin structure, wherein the source doping region is adjacent to the working gate; and forming a drain doping region in the fin structure, wherein the drain doping region is adjacent to the dummy gate, and wherein the dummy gate is disposed between the trench and the drain doping region.

18. The method according to claim 17, wherein the fin structure extends along a first direction and the trench extends along a second direction, wherein the first direction is not parallel with the second direction.

19. The method according to claim 18, wherein the first direction is perpendicular to the second direction.

20. The method according to claim 18, wherein the working gate is spaced apart from the dummy gate with the ILD layer interposed therebetween, and wherein the working gate and the dummy gate extend along the second direction.

21. The method according to claim 17 further comprising:
forming a channel region between the source doping region and the well junction that is directly under the working gate.

22. The method according to claim 17, wherein the trench isolation region comprises a silicon oxide trench-fill layer, and wherein the silicon nitride trench-fill layer in the trench has a thickness that is equal to or greater than the silicon oxide trench-fill layer, and wherein a bottom surface of the silicon nitride trench-fill layer is lower than a bottom surface of the silicon oxide trench-fill layer.

23. The method according to claim 17, wherein the ILD layer is in direct contact with the silicon nitride trench-fill layer.

24. The method according to claim 17, wherein a top surface of the silicon nitride trench-fill layer is lower than a top surface of the fin structure.

25. The method according to claim 24, wherein the trench has a first edge on the first side and above the top surface of the silicon nitride trench-fill layer, and a second edge on the opposing second side, and wherein the working gate covers the first edge and the dummy gate covers the second edge.

26. The method according to claim 17, wherein a top surface of the ILD layer is flush with a top surface of the working gate and a top surface of the dummy gate.

27. The method according to claim 17 further comprising:
forming a silicon oxide liner layer between the silicon nitride trench-fill layer and the substrate.

28. The method according to claim 17, wherein the first-type well region is a P well region and the second-type well region is an N well region.

29. The method according to claim 17, wherein the source doping region comprises a source epitaxial layer and the drain doping region comprises a drain epitaxial layer.

30. The method according to claim 29, wherein the source epitaxial layer comprises SiP and the drain epitaxial layer comprises SiP.

31. The method according to claim 29, wherein the source doping region is disposed within the first-type well region and the drain doping region is disposed within the second-type well region.

32. The method according to claim 17, wherein the substrate is a bulk silicon substrate and the fin structure is a silicon fin structure.

* * * * *